United States Patent
Nagengast et al.

(10) Patent No.: US 11,673,226 B2
(45) Date of Patent: *Jun. 13, 2023

(54) RETAINING RING FOR CMP

(71) Applicant: Applied Materials, Inc., Santa Clara, CA (US)

(72) Inventors: Andrew J. Nagengast, Sunnyvale, CA (US); Christopher Heung-Gyun Lee, San Jose, CA (US); Thomas Li, Santa Clara, CA (US); Anand N. Iyer, Cupertino, CA (US); Jie Diao, Fremont, CA (US); Huanbo Zhang, San Jose, CA (US); Erik S. Rondum, San Ramon, CA (US); Wei-Cheng Lee, Los Altos Hills, CA (US); Jeonghoon Oh, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 810 days.

This patent is subject to a terminal disclaimer.

(21) Appl. No.: 16/435,302

(22) Filed: Jun. 7, 2019

(65) Prior Publication Data

US 2019/0291238 A1 Sep. 26, 2019

Related U.S. Application Data

(63) Continuation of application No. 15/658,294, filed on Jul. 24, 2017, now Pat. No. 10,322,492.
(Continued)

(51) Int. Cl.
*B24B 37/32* (2012.01)
*H01L 21/306* (2006.01)
(Continued)

(52) U.S. Cl.
CPC ........ *B24B 37/32* (2013.01); *H01L 21/30625* (2013.01); *H01L 21/67063* (2013.01); *H01L 21/67092* (2013.01); *H01L 21/68735* (2013.01)

(58) Field of Classification Search
CPC .............. B24B 37/32; H01L 21/30625; H01L 21/67063; H01L 21/67092; H01L 21/68735
(Continued)

(56) References Cited

U.S. PATENT DOCUMENTS 5,695,392 A * 12/1997 Kim ................ B24B 57/02
451/286
5,738,574 A 4/1998 Tolles et al.
(Continued)

FOREIGN PATENT DOCUMENTS

CN 1890054 1/2007
CN 101778697 7/2010
(Continued)

OTHER PUBLICATIONS

Office Action in Japanese Appln. No. 2019-503969, dated Aug. 30, 2021, 5 pages (with English translation).
(Continued)

*Primary Examiner* — Eileen P Morgan
(74) *Attorney, Agent, or Firm* — Fish & Richardson P.C.

(57) ABSTRACT

A retaining ring includes a generally annular body having an inner surface to constrain a substrate, an outer surface, and a bottom surface. The bottom surface has a plurality of channels extending from the outer surface to the inner surface and a plurality of islands separated by the channels and providing a contact area to contact a polishing pad. Each channel includes a recessed region adjacent the outer surface such that the channel is deeper in the recessed region than in
(Continued)

a remainder of the channel. The recessed region and the remainder of the channel each have substantially uniform depth.

20 Claims, 2 Drawing Sheets

Related U.S. Application Data

(60) Provisional application No. 62/366,550, filed on Jul. 25, 2016.

(51) Int. Cl.
*H01L 21/67* (2006.01)
*H01L 21/687* (2006.01)

(58) Field of Classification Search
USPC .................................................. 451/397, 398
See application file for complete search history.

(56) References Cited

U.S. PATENT DOCUMENTS

| | | | |
|---|---|---|---|
| 6,183,354 B1 | 2/2001 | Zuniga et al. | |
| 6,267,643 B1* | 7/2001 | Teng | B24B 37/32 451/287 |
| 6,527,624 B1 | 3/2003 | Tolles et al. | |
| 6,821,192 B1* | 11/2004 | Donohue | B24B 37/32 451/285 |
| 7,029,375 B2* | 4/2006 | Phang | B24B 37/32 451/41 |
| 7,121,927 B2* | 10/2006 | Phang | B24B 37/32 451/41 |
| 7,326,105 B2* | 2/2008 | Chandrasekaran | B24B 37/32 451/285 |
| 7,347,767 B2 | 3/2008 | Chandrasekaran | |
| 7,520,795 B2* | 4/2009 | Wang | B24B 37/32 451/36 |
| 7,575,504 B2 | 8/2009 | Zuniga et al. | |
| 7,857,683 B2 | 12/2010 | Burns et al. | |
| 8,388,412 B2 | 3/2013 | Prabhu et al. | |
| 9,539,696 B2 | 1/2017 | Fukushima et al. | |
| 9,815,171 B2 | 11/2017 | Yamaki et al. | |
| 10,322,492 B2 | 6/2019 | Nagengast et al. | |
| 2005/0126708 A1 | 6/2005 | Chen et al. | |
| 2006/0046621 A1* | 3/2006 | Phang | B24B 37/32 451/41 |
| 2007/0044913 A1* | 3/2007 | Wang | B24B 37/32 156/345.12 |
| 2007/0224864 A1* | 9/2007 | Burns | B24B 37/32 439/164 |
| 2008/0171500 A1 | 7/2008 | Kuwabara et al. | |
| 2009/0021024 A1* | 1/2009 | Prabhu | B24B 37/32 411/517 |
| 2010/0041323 A1 | 2/2010 | Burns et al. | |
| 2011/0151755 A1* | 6/2011 | Burns | B24B 37/32 451/286 |
| 2012/0309276 A1* | 12/2012 | Kim | B24B 37/32 451/364 |
| 2014/0224766 A1* | 8/2014 | Chou | H01L 21/30625 216/53 |
| 2015/0303070 A1* | 10/2015 | Oh | B24B 41/06 216/53 |
| 2016/0346897 A1* | 12/2016 | Reedy | H01L 21/68721 |
| 2018/0021918 A1 | 1/2018 | Nagengast et al. | |

FOREIGN PATENT DOCUMENTS

| | | |
|---|---|---|
| CN | 204183389 | 3/2015 |
| JP | 3085480 | 5/2002 |
| JP | 2004-268194 | 9/2004 |
| JP | 2015-123532 | 7/2015 |
| KR | 20-0371228 | 1/2005 |
| KR | 20050064316 | 6/2005 |
| TW | 295560 | 1/1997 |
| TW | M268132 | 6/2005 |
| TW | 200833464 | 8/2008 |
| TW | 201524679 | 7/2015 |
| WO | WO 2018/022520 | 2/2018 |

OTHER PUBLICATIONS

TW Office Action in Taiwanese Appln. No. 106124871, dated Jan. 19, 2021, 14 pages (with English Search Report).
International Search Report and Written Opinion in International Application No. PCT/US2017/043551, dated Oct. 19, 2017, 11 pages.
CN Office Action in Chinese Application No. 201780045515.5 dated Apr. 14, 2021, 13 pages (with English translation).
CN Office Action in Chinese Application No. 201780045515.5 dated Jul. 28, 2020, 25 pages (with English translation).
Office Action in Korean Appln. No. 10-2019-7005399, dated Oct. 28, 2021, 20 pages (with English translation).
Office Action in Taiwanese Appln. No. 110132023, dated May 6, 2022, 12 pages (with English summary).
Office Action in Korean Appln. No. 10-2022-7023449, dated Dec. 27, 2022, 15 pages (with English summary).

* cited by examiner

RETAINING RING FOR CMP

CROSS-REFERENCE TO RELATED APPLICATIONS

This application is a continuation of U.S. application Ser. No. 15/658,294, filed Jul. 24, 2017, which claims priority to U.S. Application Ser. No. 62/366,550, filed on Jul. 25, 2016, the entireties of which are incorporated by reference.

TECHNICAL FIELD

The present disclosure relates to a retaining ring for a carrier head for chemical mechanical polishing.

BACKGROUND

Integrated circuits are typically formed on substrates, particularly silicon wafers, by the sequential deposition of conductive, semiconductive or insulative layers. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, such as oxide polishing, the filler layer is planarized until a predetermined thickness is left over the non-planar surface. In addition, planarization of the substrate surface is usually required for photolithography.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. A polishing liquid, such as a slurry with abrasive particles, is typically supplied to the surface of the polishing pad.

The substrate is typically retained below the carrier head by a retaining ring. However, because the retaining ring contacts the polishing pad, the retaining ring tends to wear away, and is occasionally replaced. Some retaining rings have an upper portion formed of metal and a lower portion formed of a wearable plastic, whereas some other retaining rings are a single plastic part.

SUMMARY

In one aspect, a retaining ring includes a generally annular body having an inner surface to constrain a substrate and a bottom surface, the bottom surface having a plurality of channels extending from an outer surface to the inner surface, and a plurality of islands separated by the channels and providing a contact area to contact a polishing pad, wherein the contact area is about 15-40% of a plan area of the bottom surface.

Implementations may include one or more of the following features.

The contact area may be about 25-30% of the plan area of the bottom surface.

The plurality of channels may be spaced uniformly around the annular body. There may be eight to thirty channels.

Each channel of the plurality of channels may include an inlet portion at the outer surface, a constriction extending substantially perpendicular to the width of the retaining ring, and an outlet portion extending from the constriction to the inner surface. The outlet portion may widen toward the inner surface. The inlet portion may be circumferentially longer than the outlet portion.

Each channel of the plurality of channels may include a leading edge and a trailing edge, and the leading and trailing edge need not be symmetric across a centerline of the channel. The leading edge may include a linear segment extending across substantially all of a radial width of the bottom surface. The linear segment may be oriented at an angle of about 30-60° relative to a radial direction. The trailing edge may include a first portion extending substantially along a radial direction, and a second portion that is closer to the outer surface than the inner portion that extends substantially perpendicular to the first portion.

The channel may include a recessed region adjacent the outer surface such that the channel is deeper in the recessed region than in a remainder of the channel. The recessed region and the remainder of the channel may each have substantially uniform depth.

Advantages may include one or more of the following. The pad rebound effect can be reduced, thus providing better control of the polishing rate at the substrate edge and improved polishing uniformity, particularly at the substrate edge, e.g., the outer 5 mm of the substrate.

The details of one or more implementations are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

A retaining ring can be used to press on the surface of the polishing pad in the region around a substrate. In particular, the retaining ring needs to press with sufficient force that the substrate cannot accidentally slide beneath the ring and is effectively trapped. The retaining ring can also be used to compress the polishing pad near the edge of the substrate and thus affect the polishing rate at the substrate edge. However, when the pad is compressed in this manner, the elasticity of the polishing pad, in conjunction with the relative motion between the pad and the retaining ring, can result in a "pad rebound effect," which can increase radial non-uniformity.

Two techniques can be used to reduce the pad rebound effect. First, by reducing the contact area of the retaining ring against the polishing pad, less of the pad is compressed, and thus less of the substrate is subject to the pad rebound effect. Second, certain shapes of the contact area are less likely to create the pad rebound effect.

During a polishing operation, one or more substrates can be polished by a chemical mechanical polishing (CMP)

apparatus that includes a carrier head 100. A description of a CMP apparatus can be found in U.S. Pat. No. 5,738,574.

Figure 1:
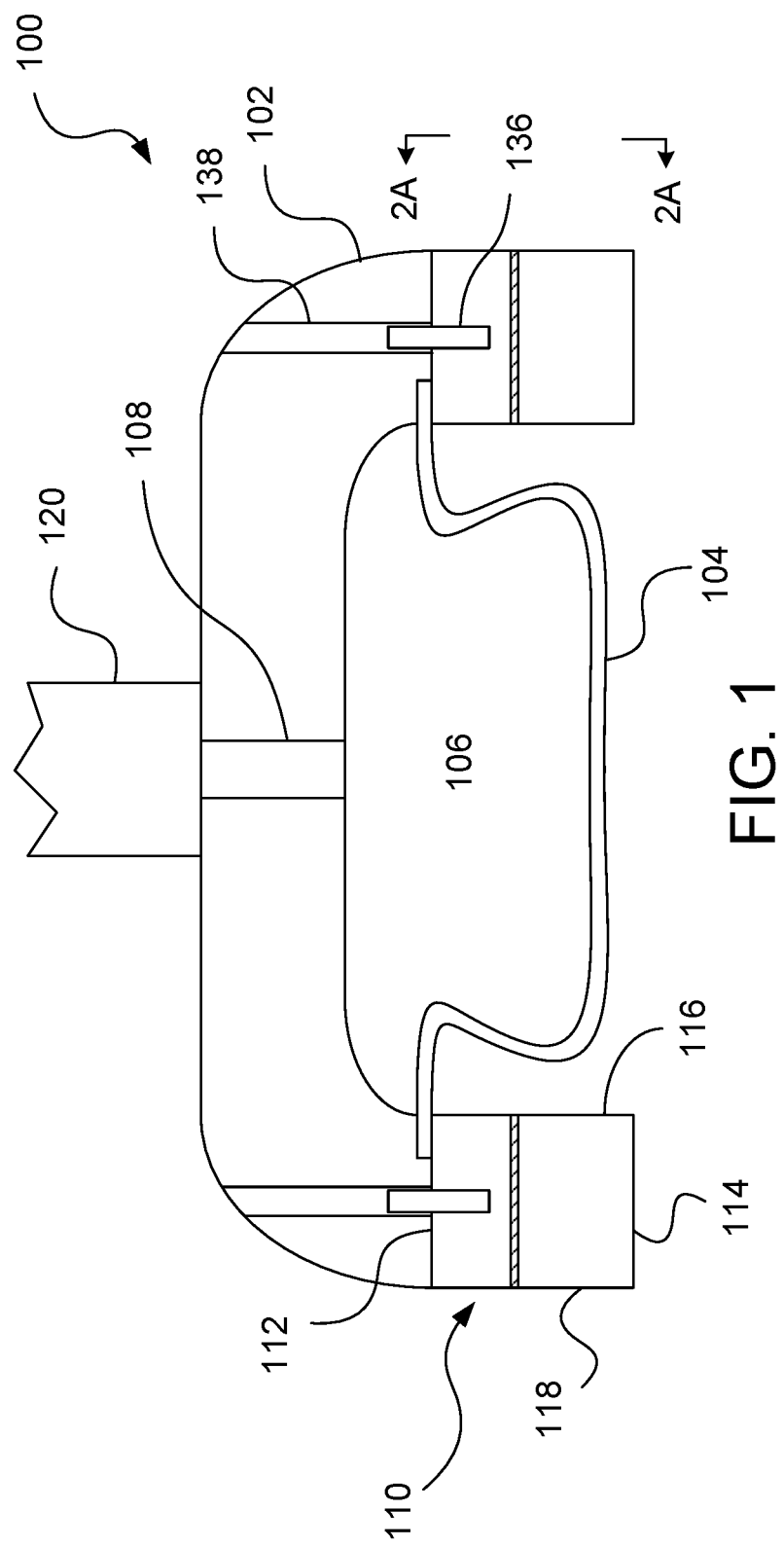
FIG. 1 is a schematic cross-sectional view of a carrier head.

Referring to FIG. 1, an exemplary simplified carrier head 100 includes a base 102, a flexible membrane 104 that provides a mounting surface for the substrate, a pressurizable chamber 106 between the membrane 104 and the base 102, and a retaining ring 110 secured near the edge of the base 102 to hold the substrate below membrane 104. Although FIG. 1 illustrates the membrane 104 as clamped between the retaining ring 110 and the base 102, one or more other parts, e.g., clamp rings, could be used to hold the membrane 104. A drive shaft 120 can be provided to rotate and/or translate the carrier head across a polishing pad. A pump may be fluidly connected to the chamber 106 though a passage 108 in the base to control the pressure in the chamber 106 and thus the downward pressure of the flexible membrane 104 on the substrate.

The retaining ring 110 may be a generally annular ring secured at the outer edge of the base 102, e.g., by screws or bolts 136 that extend through passages 138 in the base 102 into aligned threaded receiving recesses in the upper surface 112 of the retaining ring 110. In some implementations, the drive shaft 120 can be raised and lowered to control the pressure of a bottom surface 114 of the retaining ring 110 on a polishing pad. Alternatively, the retaining ring 110 can be movable relative to the base 102, and the carrier head 100 can include an internal chamber which can be pressurized to control a downward pressure on the retaining ring, e.g., as described in U.S. Pat. No. 6,183,354 or 7,575,504. The retaining ring 110 is removable from the base 102 (and the rest of the carrier head) as a unit. In the case of the retaining ring 110, this means that an upper portion 142 of the retaining ring 110 remains secured to a lower portion 140 of the retaining ring while the retaining ring 110 is removed, without requiring disassembly of the base 102 or removal of the base 102 from the carrier head 100.

An inner diameter surface 116 of retaining ring 110 defines, in conjunction with the lower surface of the flexible membrane 104, a substrate receiving recess. The retaining ring 110 prevents the substrate from escaping the substrate receiving recess.

The retaining ring 110 can include multiple vertically stacked sections, including the annular lower portion 140 having the bottom surface 114 that may contact the polishing pad, and the annular upper portion 142 connected to base 102. The lower portion 140 can be bonded to the upper portion 142 with an adhesive layer 144.

The lower portion 140 is a plastic, e.g., polyphenol sulfide (PPS). The plastic of the lower portion 140 is chemically inert in a CMP process. In addition, the lower portion 140 should be sufficiently elastic that contact of the substrate edge against the retaining ring does not cause the substrate to chip or crack. On the other hand, lower portion 140 should be sufficient rigid to have sufficient lifetime under wear from the polishing pad (on the bottom surface) and substrate (on the inner surface). The plastic of the lower portion 140 can have a durometer measurement of about 80-95 on the Shore D scale. In general, the elastic modulus of the material of lower portion 140 can be in the range of about $0.3-1.0 \times 10^6$ psi. Although the lower portion can have a low wear rate, it is acceptable for the lower portion 140 to be gradually worn away, as this appears to prevent the substrate edge from cutting a deep grove into the inner surface 116.

The plastic of the lower portion 140 may be (e.g., consist of) polyphenylene sulfide (PPS), polyaryletherketone (PAEK), polyetheretherketone (PEEK) or polyetherketoneketone (PEKK).

The upper portion 142 of retaining ring 110 can be a harder material, e.g., a metal, ceramic or harder plastic, than the lower portion 140. An adhesive layer 144 can be used to secure the upper portion 140 to the lower portion 142, or the upper portion 140 and the lower portion 142 can be connected with screws (e.g., that extend through an aperture in the upper portion 140 into a receiving threaded recess or screw sheath in the lower portion 142), press-fit together, or joined by sonic molding. Alternatively, rather than having a lower portion and an upper portion, the entire retaining ring 110 can be formed of the same material, e.g., a plastic of the lower portion as described above.

The inner surface 116 of the lower portion 140 of the retaining ring can have an inner diameter D just larger than the substrate diameter, e.g., about 1-2 mm larger than the substrate diameter, so as to accommodate positioning tolerances of the substrate loading system. The retaining ring 110 can have a radial width of about half an inch.

Figure 2:
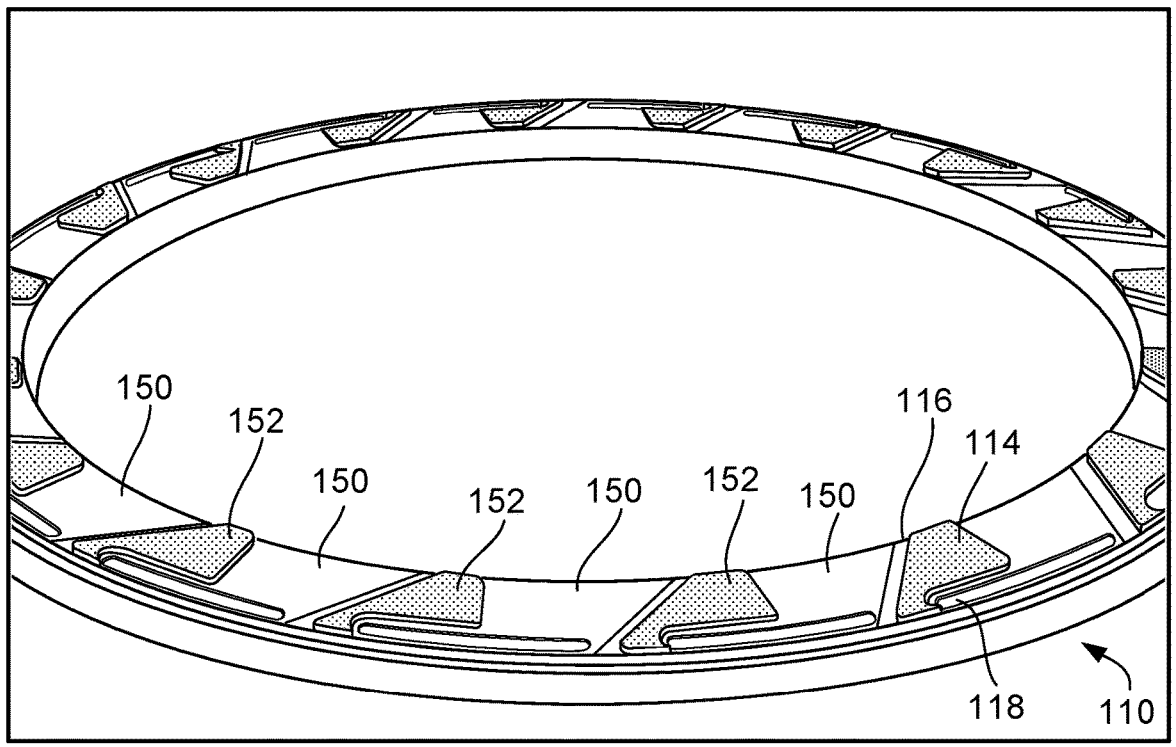
FIG. 2 is a perspective view of a retaining ring.
Figure 3:
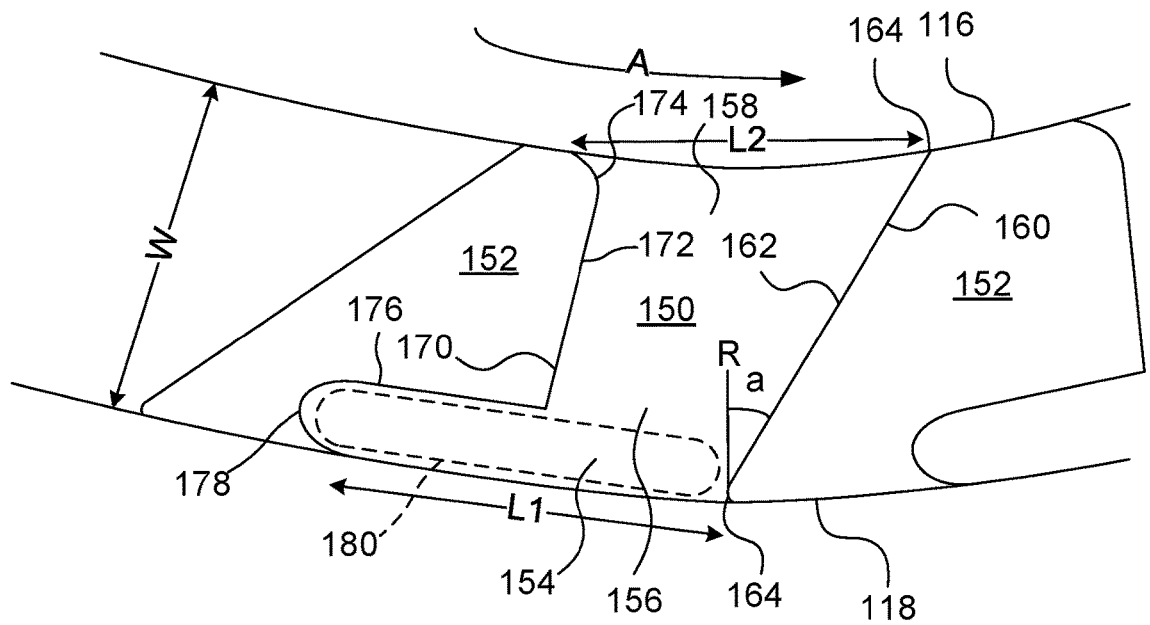
FIG. 3 is a schematic bottom view of the retaining ring.

FIGS. 2 and 3 illustrate a retaining ring 110 in which the bottom surface 114 includes a plurality of channels 150 that extend from the inner diameter surface 116 to an outer diameter surface 118. The bottom surface 114 also includes islands 152, each pair of adjacent islands 152 separated by one of the channels 150. Each channel 150 can have the same shape in the plan bottom view as the other channels; similarly, each island 152 can have the same shape as the other islands.

The islands 152 provide the contact area of the bottom surface 140 against the polishing pad. The islands 152 can provide a contact area that is about 15-40%, e.g., 25-30%, of the plan area of the bottom surface. The plan area of the bottom surface can be calculated as $\pi(R_O^2-R_I^2)$, where $R_O$ is the radius of the outer diameter and $R_I$ is the radius of the inner diameter of the ring 110.

The side walls of the channels 150 can be substantially perpendicular to the surfaces of the islands 152 so that the contact area as a percentage of the plan area does not change as the retaining ring wears. The channels 150 (and thus the islands 152) can be positioned with uniform spacing circumferentially around the retaining ring 110. There may be eight to thirty channels 150, e.g., eighteen channels.

Each channel 150 includes a leading edge 160 and a trailing edge 170. Assuming the carrier head, and thus the retaining ring, is rotating in a counter-clockwise direction (as viewed from the bottom side of the ring, shown by arrow A), the leading edge 160 is the right edge and the trailing edge 170 is the left edge (again, as viewed from the bottom side of the ring).

The leading edge 160 can be entirely or mostly a linear segment 162. The linear portion 172 can extend across about 90-100% of the radial width W of the bottom surface 114 of the retaining ring 110. However, one or more of the corners 164 where the leading edge 160 intersects the inner diameter surface 116 or outer diameter surface 118 can be rounded. At the outer edge 118, the linear segment of the leading edge 160 can be at an angle α relative to the radial direction R that passes through the center of the retaining ring 110. The angle α can be between 30° and 60°, e.g., 45°.

The trailing edge 170 includes a linear portion 172 that extends substantially radially, e.g., in a direction that passes through the center of the retaining ring 110. The angle between the linear portion 172 and the radial direction from the center of the linear portion 172 can be less than 10°. The linear portion 172 can extend across about 25-75% of the radial width W of the bottom surface 114 of the retaining ring 110. A corner 174 where the trailing edge 170 intersects the inner diameter surface 116 can be rounded.

The trailing edge 170 also includes an azimuthally extending portion 176 that extends in the trailing direction, i.e., away from the leading edge 160 of the channel 150. The azimuthally extending portion 176 can be a linear section, or can be curved, e.g., to be concentric with the inner diameter surface 116 and outer diameter surface 118. The azimuthally extending portion 176 can extend across about 50-80% of the circumferential length of the island 152 at the outer diameter surface 118.

The trailing edge 170 also includes a section 178 that connects the azimuthally extending portion 176 to the outer diameter surface 118. This section 178 can be U-shaped, and curve around from the azimuthally extending portion 176 to the outer diameter surface 118.

Taken from outside inward, the resulting channel 150 has an inlet portion 154 at the outer diameter surface 118, a sudden constriction 156 where the azimuthally extending portion 176 cuts across, and then an outlet portion 158 that widens toward the inner diameter surface 116. The circumferential length L1 of the inlet at the outer diameter surface 118 can be larger than the circumferential length L2 of the outlet at the inner diameter surface 116. The wide inlet portion 154 in conjunction with the U-shaped section 178 of the inlet 154 can help "scoop" slurry from the polishing pad and direct the slurry inwardly toward the substrate.

Optionally, a recess 180 can be formed in the inlet portion 154 of the channel 180. That is, the channel 150 is deeper in the inlet portion 154 than in the outlet portion 158. The recess 180 can have a uniform depth, and the outlet portion 158 can also have a uniform depth.

A number of embodiments have been described. However, many variations are possible. For example, rather than the complicated channel and island shapes described above, the islands can be simple linear stripes with a width selected to provide the desired percentage of contact area. For example, the trailing and leading edge of each island can be provided by two parallel linear segments. The edges can be rounded at the inner and outer diameter surfaces. Thus, the scope of the invention is defined by the appended claims.

What is claimed is:

1. A retaining ring, comprising:
a generally annular body having an inner surface to constrain a substrate, an outer surface, and a bottom surface, the bottom surface having a plurality of channels extending from the outer surface to the inner surface and a plurality of islands separated by the channels and providing a contact area to contact a polishing pad, wherein each channel includes a recessed region adjacent the outer surface such that the channel is deeper in the recessed region than in a remainder of the channel, and the recessed region and the remainder of the channel each have substantially uniform depth.

2. The retaining ring of claim 1, wherein the channel includes an inlet portion adjacent the outer surface, an outlet portion adjacent the inner surface, and a constriction between the inlet portion and the outlet portion.

3. The retaining ring of claim 2, wherein the recessed region substantially fills the inlet portion up to the constriction.

4. The retaining ring of claim 2, wherein the constriction is defined by a side wall of the channel that extends substantially perpendicular to the width of the retaining ring.

5. The retaining ring of claim 2, wherein the outlet portion widens toward the inner surface.

6. The retaining ring of claim 5, wherein the inlet portion is circumferentially longer than the outlet portion.

7. The retaining ring of claim 1, wherein the plurality of channels are spaced uniformly around the annular body.

8. The retaining ring of claim 7, wherein there are eight to thirty channels.

9. A retaining ring, comprising:
a generally annular body having an inner surface to constrain a substrate, an outer surface, and a bottom surface, the bottom surface having a plurality of channels extending from the outer surface to the inner surface and a plurality of islands separated by the channels and providing a contact area to contact a polishing pad, wherein each channel has the same shape and each island has the same shape, wherein each channel of the plurality of channels comprises a trailing edge and a leading edge that are asymmetric across a centerline of the channel, and the trailing edge of each channel includes a substantially azimuthally extending portion and a U-shaped section that connects to the outer surface.

10. The retaining ring of claim 9, wherein the azimuthally extending portion defines a sudden constriction between an inlet portion and an outlet portion of the channel.

11. The retaining ring of claim 10, wherein the azimuthally extending portion is linear.

12. The retaining ring of claim 10, wherein the azimuthally extending portion is curved.

13. The retaining ring of claim 10, wherein the inlet portion is circumferentially longer than the outlet portion.

14. The retaining ring of claim 9, wherein the leading edge of each channel is substantially linear.

15. The retaining ring of claim 14, wherein the leading edge is oriented at an angle of about 30-60° relative to a radial direction through the leading edge.

16. The retaining ring of claim 9, wherein the azimuthally extending portion extend across about 50-80% of a circumferential length of the island at the outer surface.

17. The retaining ring of claim 9, wherein at least one corner where the leading edge or trailing edge of each channel intersects the inner surface or outer surface is rounded.

18. A retaining ring, comprising:
a generally annular body having an inner surface to constrain a substrate, an outer surface, and a bottom surface, the bottom surface having a plurality of channels extending from the outer surface to the inner surface and a plurality of islands separated by the channels and providing a contact area to contact a polishing pad, wherein each channel has the same shape and each island has the same shape, wherein each channel of the plurality of channels comprises a leading edge and a trailing edge that are asymmetric across a centerline of the channel, and the trailing edge of each channel includes a substantially azimuthally extending portion, wherein the trailing edge includes a first substantially radially extending portion connecting the outer surface to the substantially azimuthally extending portion, and a second substantially radially extending portion connecting the substantially azimuthally extending portion to the inner surface.

19. The retaining ring of claim 18, wherein the second substantially radially extending portion is substantially linear.

20. The retaining ring of claim 18, wherein the first substantially radially extending portion is U-shaped.

* * * * *